United States Patent
Xu et al.

(10) Patent No.: US 7,868,340 B2
(45) Date of Patent: Jan. 11, 2011

(54) METHOD AND APPARATUS FOR GENERATING WHITE LIGHT FROM SOLID STATE LIGHT EMITTING DEVICES

(75) Inventors: Tao Xu, Fremont, CA (US); Rene Peter Helbing, Palo Alto, CA (US)

(73) Assignee: Bridgelux, Inc., Livermore, CA (US)

( * ) Notice: Subject to any disclaimer, the term of this patent is extended or adjusted under 35 U.S.C. 154(b) by 166 days.

(21) Appl. No.: 12/130,459

(22) Filed: May 30, 2008

(65) Prior Publication Data

US 2009/0296369 A1    Dec. 3, 2009

(51) Int. Cl.
    *H01L 33/00* (2010.01)
(52) U.S. Cl. .................. 257/98; 257/451; 257/E33.061
(58) Field of Classification Search .................. 257/98, 257/451
    See application file for complete search history.

(56) References Cited

U.S. PATENT DOCUMENTS

| | | | |
|---|---|---|---|
| 5,660,461 A | 8/1997 | Ignatius et al. | |
| 5,998,925 A | 12/1999 | Shimizu et al. | |
| 6,069,440 A | 5/2000 | Shimizu et al. | |
| 6,163,557 A | 12/2000 | Dunnrowicz et al. | |
| 6,576,930 B2 | 6/2003 | Reeh et al. | |
| 6,614,179 B1 | 9/2003 | Shimizu et al. | |
| 6,653,778 B1* | 11/2003 | Tomiuchi et al. | 313/501 |
| 6,812,500 B2 | 11/2004 | Reeh et al. | |
| 6,870,191 B2 | 3/2005 | Niki et al. | |
| 7,026,756 B2 | 4/2006 | Shimizu et al. | |
| 7,078,732 B1 | 7/2006 | Reeh et al. | |
| 7,087,732 B2 | 8/2006 | Fodor et al. | |
| 7,151,283 B2 | 12/2006 | Reeh et al. | |
| 7,250,715 B2* | 7/2007 | Mueller et al. | 313/485 |
| 7,362,048 B2 | 4/2008 | Shimizu et al. | |
| 7,531,960 B2 | 5/2009 | Shimizu et al. | |
| 2004/0016908 A1 | 1/2004 | Hohn et al. | |
| 2008/0048200 A1 | 2/2008 | Mueller et al. | |
| 2009/0272998 A1* | 11/2009 | Berben et al. | 257/98 |
| 2010/0020531 A1* | 1/2010 | Choi et al. | 362/84 |

FOREIGN PATENT DOCUMENTS

| | | |
|---|---|---|
| DE | PCT/DE97/01337 | 6/1997 |
| DE | 19625622 | 1/1998 |
| DE | 19638667 | 4/1998 |
| DE | 29724543 U1 | 4/2002 |
| DE | 29724582 U1 | 8/2002 |
| JP | 2900928 | 4/1998 |
| JP | 2927279 | 9/1998 |
| JP | 3700502 | 7/2000 |

(Continued)

*Primary Examiner*—Wai-Sing Louie
(74) *Attorney, Agent, or Firm*—JW Law Group; James M. Wu

(57) ABSTRACT

An optical device capable of generating warm light using an array of phosphor islands situated over a phosphor layer is disclosed. The device includes a solid state light emitter, a phosphor layer, and phosphor islands. The solid state light emitter, in an aspect, is a light emitting diode ("LED") capable of converting electrical energy to optical light. The phosphor layer is disposed over the solid state light emitter for generating luminous cool light in response to the optical light. Multiple phosphor islands are disposed on the phosphor layer for converting cool light to warm light, wherein the phosphor islands are evenly distributed over the phosphor layer.

20 Claims, 10 Drawing Sheets

FOREIGN PATENT DOCUMENTS

| | | |
|---|---|---|
| JP | 3503139 | 3/2004 |
| JP | 3724490 | 6/2004 |
| JP | 3724498 | 12/2004 |
| WO | WO 97/50132 A1 | 12/1997 |
| WO | WO 98/12757 A1 | 3/1998 |
| WO | WO 01/08452 A1 | 2/2001 |
| WO | WO 01/08453 A1 | 2/2001 |

* cited by examiner

METHOD AND APPARATUS FOR GENERATING WHITE LIGHT FROM SOLID STATE LIGHT EMITTING DEVICES

FIELD

The exemplary aspect(s) of the present invention relates to lighting devices. More specifically, the aspect(s) of the present invention relates to solid state light emitting devices.

BACKGROUND

With decades of technical advancements and breakthroughs in the areas of semiconductor based solid state light emitting devices, Edison's incandescent light bulbs, which typically have 30% or less light efficiency, will soon be replaced with energy-efficient light emitting diodes ("LEDs"). A conventional LED is small and power efficient with good lifetime. Various commercial applications of LEDs, such as traffic lights as well as electronic billboards, have already placed in service.

An LED is a semiconductor diode with a biased p-n junction capable of emitting narrow-spectrum light or electroluminescence. Color of emitted light typically depends on the composition of material used in the device. Color variations for visible light are usually defined by electromagnetic radiation or optical wavelengths from approximately 400 nm (nanometer) to 700 nm. The quality of a light source on color appearance of objects is usually measured by the Color Rendering Index ("CRI"), wherein the highest CRI rating is 100. Typical cool white fluorescent lamps, for example, have a CRI of 62. On the other hand, lamps having rare-earth phosphors can be constructed with CRI of 80 or better.

A problem associated with a typical LED for indoor lighting is a low CRI rating, which could distort true color of objects. To enhance the color appearance, a conventional approach is to mix red phosphor with yellow phosphor to generate warm or neutral white light. Another conventional approach is to dispense two continuous red and yellow phosphor layers one on top of another to generate warm or neutral white light. A drawback, however, associated with these approaches is low light output ("LOP") or low lighting efficiency. LOP can be defined as a measurement of light luminosity, luminous flux, luminous intensity, light brightness, and the like.

Another approach to improve CRI rating is to combine yellow LEDs capable of emitting cool light with red LEDs capable of emitting red light. The combination of cool white light with red light enhances CRI rating. A drawback, however, associated with this approach is that the process of combining red LEDs with yellow LEDs involves a complicated assembling procedure. In addition, combining red and yellow LEDs may require additional circuitry on a control circuit board.

SUMMARY

A lighting device capable of generating warm white and neutral white light using phosphor islands disposed over a phosphor layer is disclosed. The device includes a solid state light emitter, a phosphor layer, and phosphor islands. The solid state light emitter, in an aspect, is a light emitting diode ("LED") capable of converting electrical energy to optical light. The phosphor layer is disposed over the solid state light emitter for generating luminous cool white light in response to the optical light. Multiple phosphor islands are disposed on the phosphor layer for converting cool white light to warm light, wherein the phosphor islands are evenly distributed over the phosphor layer. In an aspect, optical wavelengths for the phosphor layer are shorter than the optical wavelengths of the phosphor islands. For example, the phosphor layer may be a yellow phosphor layer while phosphor islands may be red phosphor islands. It should be noted that mixing the cool white light with converted warm light generates natural light, which has a physical property of improved CRI and light output.

Additional features and benefits of the exemplary aspect(s) of the present invention will become apparent from the detailed description, figures and claims set forth below.

BRIEF DESCRIPTION OF THE DRAWINGS

The exemplary aspect(s) of the present invention will be understood more fully from the detailed description given below and from the accompanying drawings of various aspects of the invention, which, however, should not be taken to limit the invention to the specific aspects, but are for explanation and understanding only.

DETAILED DESCRIPTION

Figure 1:
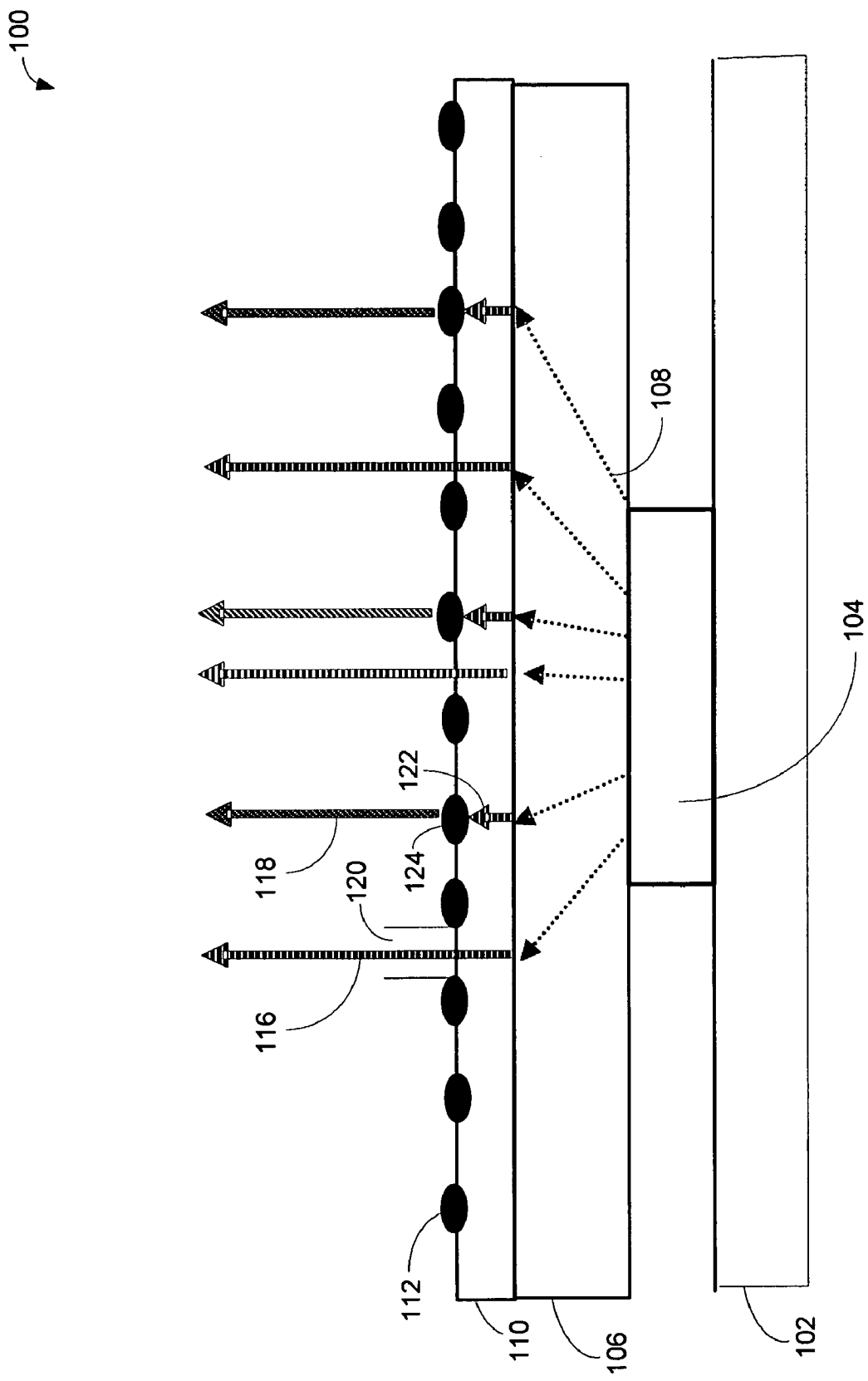
FIG. 1 is a cross-section view of an optical device illustrating an array of phosphor islands distributed over a phosphor layer for generating warm white and neutral white light in accordance with an aspect of the present invention.

Aspect(s) of the present invention is described herein in the context of a method, device, and apparatus of generating warm light using phosphor islands distributed light emitting device.

Those of ordinary skills in the art will realize that the following detailed description of the exemplary aspect(s) is illustrative only and is not intended to be in any way limiting.

Other aspects will readily suggest themselves to such skilled persons having the benefit of this disclosure. Reference will now be made in detail to implementations of the exemplary aspect(s) as illustrated in the accompanying drawings. The same reference indicators will be used throughout the drawings and the following detailed description to refer to the same or like parts.

In the interest of clarity, not all routine features of the implementations described herein are shown and described. It will, of course, be understood that in the development of any such actual implementation, numerous implementation-specific decisions may be made in order to achieve the developer's specific goals, such as compliance with application- and business-related constraints, and that these specific goals will vary from one implementation to another and from one developer to another. Moreover, it will be understood that such a development effort might be complex and time-consuming, but would nevertheless be a routine undertaking of engineering for those of ordinary skills in the art having the benefit of this disclosure.

It is understood that the aspect of the present invention may contain integrated circuits that are readily manufacturable using conventional semiconductor technologies, such as for example CMOS ("complementary metal-oxide semiconductor") technology, or other semiconductor manufacturing processes. In addition, the aspect of the present invention may be implemented with other manufacturing processes for making optical as well as electrical devices.

Those of ordinary skills in the art will now realize that the devices described herein may be formed on a conventional semiconductor substrate or they may as easily be formed as a thin film transistor (TFT) above the substrate, or in silicon on an insulator (SOI) such as glass (SOG), sapphire (SOS), or other substrates as known to those of ordinary skills in the art. Such persons of ordinary skills in the art will now also realize that a range of doping concentrations around those described above will also work. Essentially, any process capable of forming pFETs and nFETs will work. Doped regions may be diffusions or they may be implanted.

The present aspect(s) of the invention illustrates a lighting device, which is capable of generating warm white and neutral white light using multiple red phosphor islands evenly distributed over a lighting element. The device includes a solid state light emitter, a yellow phosphor layer, and multiple red phosphor islands. The solid state light emitter, for example, is a light emitting diode ("LED") capable of converting electrical energy to optical light. The yellow phosphor layer is disposed over the solid state light emitter for generating luminous cool light in response to the optical light. Red phosphor islands, which are evenly distributed over the phosphor layer, are capable of converting a portion of cool light to red light. The warm white or the natural white light is generated after red light and cool white light are combined.

FIG. 1 illustrates a cross-section view of an optical device 100 capable of generating warm white or natural white light using an array of phosphor islands in accordance with an aspect of the present invention. Device 100 includes a substrate 102, a solid state light emitter 104, a light extracting layer 106, a phosphor layer 110, and an array of phosphor islands 112. Device 100, in an aspect, is configured to combine red light 118 with cool white light 116 to generate warm white or natural white or neutral white light. Note that optical device 100 can also be referred to as a lighting device, a solid state light emitting device, a semiconductor lighting device, et cetera. It should be noted that the underlying concept of the exemplary aspect(s) of the present invention would not change if one or more blocks (or layers) were added to or removed from device 100.

Solid state light emitter 104, in one example, is a light emitting die, which can be manufactured by a semiconductor fabrication process. A function of solid state light emitter 104 is to convert electrical energy to optical light. Solid state light emitter 104 can be a light emitter diode ("LED"), which is capable of transferring electrical energy to optical energy via a biased p/n junction. The terms LED, optical light emitter die, and solid state light emitter are used interchangeably hereinafter. Solid state light emitter or LED 104 can be installed or attached to a substrate 102, wherein substrate 102 facilitates communication between LED 104 and other devices via contacts and wire bond connections located on substrate 102. LED chips, for example, can be bonded either directly onto a substrate or a regular LED reflector cup, not shown in FIG. 1. It should be noted that solid state light emitter can be replaced with any other types of lighting elements capable of converting electrical energy to optical light (or visible lightings).

Referring to FIG. 1, a first surface of LED 104 is attached to substrate 102 and a second surface of LED 104 is coupled to a light extracting layer 106. Light extracting layer 106, in an aspect, is a clear silicone layer capable of extracting or amplifying optical light or blue light emitted by LED 104. For example, light extracting layer 106 assists LED 104 to generate sufficient blue optical light to satisfy a predefined laminating requirement. Blue light emitted by LED 104 via clear silicone layer 106 enhances luminous intensity or luminous flux of the optical light. It should be noted that light extracting layer 106 is not necessary in order for device 100 to work. LED 104, however, may not produce sufficient optical light without light extracting layer 106. As such, a more powerful and larger LED or a LED with better light extraction may be required to achieve similar results as if a light extracting layer was employed.

Light extracting layer 106, in an aspect, is structured in a sheet or a layer formation, as illustrated in FIG. 1. Light extracting layer 106 can also be structured in a dome shape around LED 104. A light extracting dome, for example, should perform substantially the same function(s) as light extracting layer 106. It should be further noted that light extracting layer 106 or light extracting dome is not necessary in order for LED 104 to emit light. A first surface of light extracting layer 106 is attached to LED 104, while a second surface of light extracting layer 106 is attached to a phosphor layer 110.

Phosphor layer 110, in an aspect, is a continuous yellow phosphor layer disposed over light extracting layer 106 and/or LED 104. A function of phosphor layer 110 is to convert blue light to bright yellow light. The blue light or blue optical light, which generally has relatively low luminous intensity, is emitted from LED 104 via light extracting layer 106. The bright yellow light, on the other hand, is also referred to as cool light, cool white light, or luminous cool light and it contains relatively high luminous intensity or flux or LOP.

In an aspect, phosphor layer 110 is a continuous green phosphor layer over light extracting layer 106. The green phosphor layer is capable of generating bright cool light in accordance with blue optical light emitted by LED 104. Blue optical light enters at one side of phosphor layer 110 and cool light (or cool white light) leaves from another side of phosphor layer 110. As mentioned earlier, although cool white light provides higher LOP, it offers poor CRI rating. It should be noted that other colors of phosphor layer may be used to replace the yellow or green phosphor layer as long as they have an optical wavelength range from 490 nm to 590 nm. Optical wavelengths are also known as electromagnetic radiation wavelengths, radiation wavelengths, visible light wavelengths, optical spectrum wavelengths, and the like.

Phosphor layer 110 includes various material substances such as phosphor for creating a phenomenon of phosphorescence. Phosphorescence, for example, is a lighting process wherein energy absorbed by the substance is released relatively slowly in the form of light. Depending on selected color, different colors of phosphors can be made from one or more substances, such as oxides, sulfides, selenides, halides, silicates of zinc, cadmium, manganese, aluminum, silicon, and the like. Phosphor substances may further include activators that are used to prolong the emission of light. For example, phosphors may include copper-activated zinc sulfide or silver-activated zinc sulfide. It should be noted that similar phosphor-like layers may be used to replace phosphor layer 110 to achieve similar lighting results.

Multiple phosphor islands 112, as shown in FIG. 1, are arranged in an array formation, in which sufficient space between phosphor islands is allocated. For example, spacing 120 between phosphor islands 112 may be used to create a passage for cool white light 116 to pass. As mentioned before, cool white light generally provides high LOP. Phosphor islands 112, in an aspect, are capable of converting at least a portion 122 of cool white light to warm light 118 (or neutral white). Upon generation of warm light 118, it is mixed or combined with cool white light 116 to generate cool white (with high CRI), warm, or natural white light. The cool white, warm white or natural white light should have a CRI range of 70 to 100.

Phosphor islands 112, for example, can be dispensed onto phosphor layer 110 by a dot jet dispenser. In another aspect, a method of screen printing can be used to dispense phosphor islands 112 onto phosphor layer 110. Also, a pre-fabricated film containing an array of phosphor islands 112 may be used to laminate the film onto phosphor layer 110. Depending on applications, phosphor islands 112 may be reshaped to a large island or dot for providing warm light. The physical shape of each island 112 can also vary depending on applications. It should be noted that different physical shapes can cause different angles of light beam(s). With changing of physical shape of phosphor islands, specific warm beam angles can be achieved. For example, a dome shaped island can provide wider angle of light beams to spread or scatter warm light 118 into cool white light 116. Phosphor islands 112 may also be referred to as phosphor objects, phosphor dots, optical islands, phosphor bars, and so forth.

In an aspect, phosphor islands 112 are configured to be red phosphor islands capable of generating red (or warm) light in response to a portion of cool white light. For example, a portion of cool white light 122 enters in one side of a red phosphor island 124 from phosphor layer 110 and red light or warm light 118 leaves from another side of red phosphor islands 124. Note that as soon as the yellow light hits a red phosphor island, the yellow light is immediately converted into red or warm light. Red light mixed with cool yellow light generates warm white or neutral white light. Red light from phosphor islands improves overall CCT (Correlated Color Temperature) and CRI rating. CCT and CRI are a measurement used to evaluate color quality of generated light.

Phosphor islands 112, in another example, are orange phosphor islands or objects or dots for providing orange light. Combining orange light with yellow or green cool light generates warm white or neutral white light. Other colors of phosphor islands can also be used to replace red or orange phosphor islands as long as they have an optical wavelength range from 590 nm to 700 nm. It should be noted that although orange or red light have lower efficiency (LOP) than yellow light, orange or red light enhances CRI rating.

It should be noted that underlying concept of the exemplary aspect(s) of the present invention would not change if dimension(s) of substrate 102, solid state light emitter 104, light extracting layer 106, phosphor layer, and/or phosphor islands 112 are changed. In an aspect, the size of substrate 102 is smaller than light emitter 104. In another aspect, the size of light extracting layer is smaller than light emitter 104. The size of phosphor layer 110 can also vary depending on the application. For example, device 100 produces similar light with similar CRI rating if the size of phosphor layer 110 becomes larger than light extracting layer 106. In addition, the size and shape of phosphor islands 112 can also vary depending on applications.

An advantage of using optical device 100 having phosphor islands distributed over a phosphor layer is to provide warm white and neutral white lighting together with enhanced LOP and CRI rating.

Figure 2:
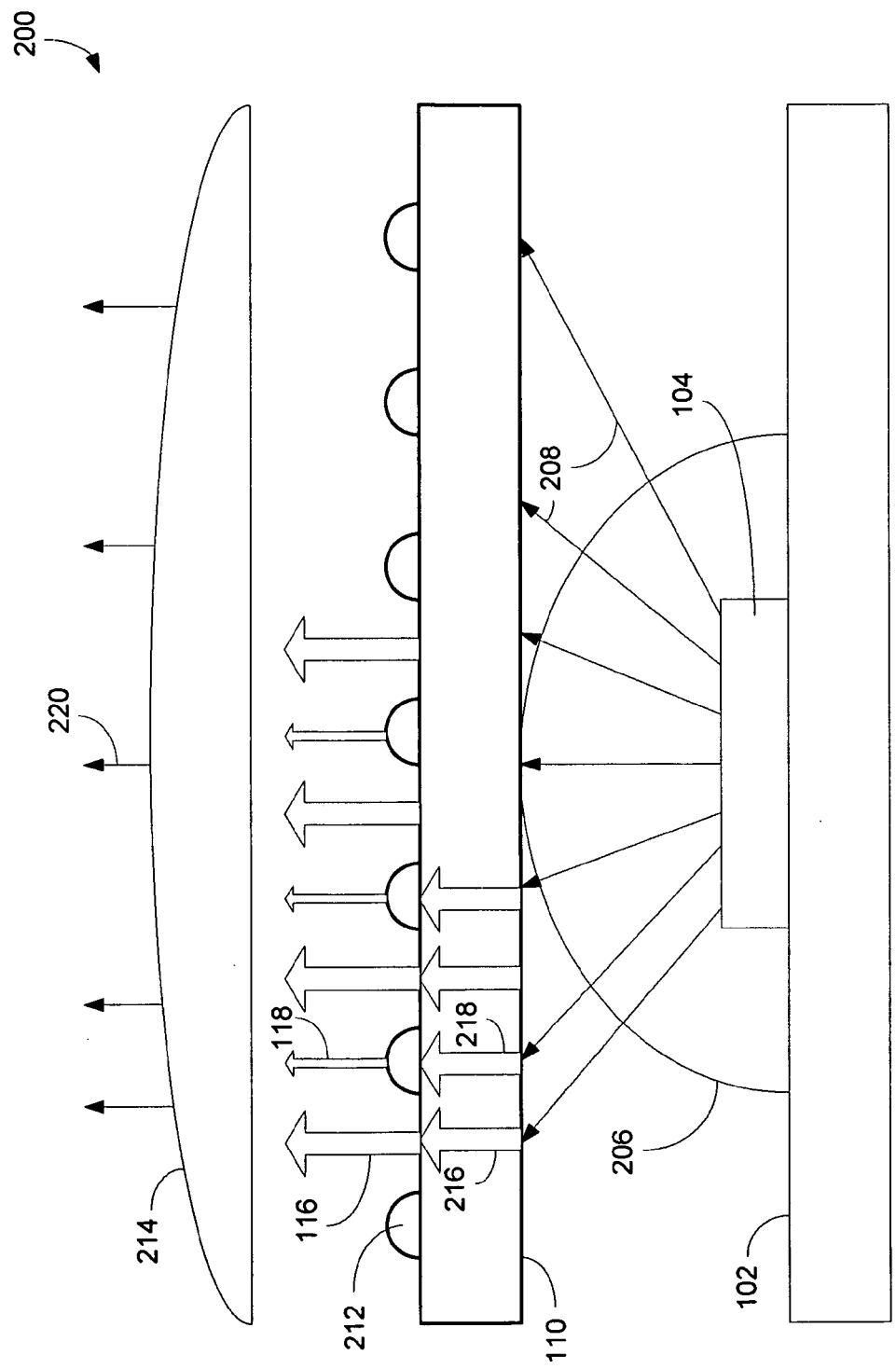
FIG. 2 is a cross-section view of an example of an optical device illustrating an array of phosphor islands over a phosphor layer for generating warm light in accordance with an aspect of the present invention.

FIG. 2 illustrates a cross-section view of an optical device 200 having an array of phosphor islands in accordance with an aspect of the present invention. Device 200 includes a substrate 102, an LED 104, a light extracting dome 206, a phosphor layer 110, a lens 214 and an array of phosphor dome islands 212. Since the same reference indicators or numbers between the figures refer to the same or substantially the same components, the components, which have been described previously, are not described again. Device 200, similar to device 100, is capable of generating natural white or natural visible light via combining cool white light 116 with warm light 118. It should be noted that the underlying concept of the exemplary aspect(s) of the present invention would not change if one or more blocks (or layers) were added to or removed from device 200.

Light extracting dome 206, in an aspect, is a clear silicone dome capable of extracting or amplifying optical light emitted by LED 104. For example, light extracting dome 206 assists LED 104 to generate sufficient blue light for lighting. Blue light emitted by LED 104 via clear silicone dome 206 enhances luminous intensity. It should be noted that light extracting dome 206 is not necessary in order for device 200 to emit light. LED 104, however, may not emit as much light as it would have if light extracting dome 206 is present. When light extracting dome 206 is absent, a more powerful LED or LED with better light extraction or performance may be required to compensate the missing dome. It should be noted that dome 206 may or may not contact phosphor layer 110. Other layer, substances, liquid, and/or gas may be added between dome 206 and phosphor layer 110.

Phosphor islands 212 are arranged in an array formation, wherein each island is structured in a dome or lens shape. Spacing between phosphor islands 212 is used to facilitate a passage for cool white light 116. Blue light 208, for example, enters phosphor layer 110 and travel through phosphor layer 110 as light 216. Spacing between islands 212 allows light 216 to exit phosphor layer 110 and become cool white light 116 without impediment or obstruction before cool white light 116 reaches lens 214. Dome shaped phosphor islands 212, in an aspect, are configured to scatter warm or red light in response to various angles of each dome. An advantage of using dome shaped phosphor islands 212 is to better facilitate and control distribution of warm light.

Lens 214 is a glass, plastic, or silicon lens used for protecting phosphor islands 212 and device 200. In one aspect, lens 214 can also improve the light output. In addition to providing device protection, lens 214 may also provide a function of integrating red light 118 into cool white light 116 to produce warm white or natural white light 220. In another aspect, lens 214 can also be used to congregate light to form one or more light beams. It should be noted that additional layers or gas may be added between lens 214 and phosphor islands 212.

Figure 3:
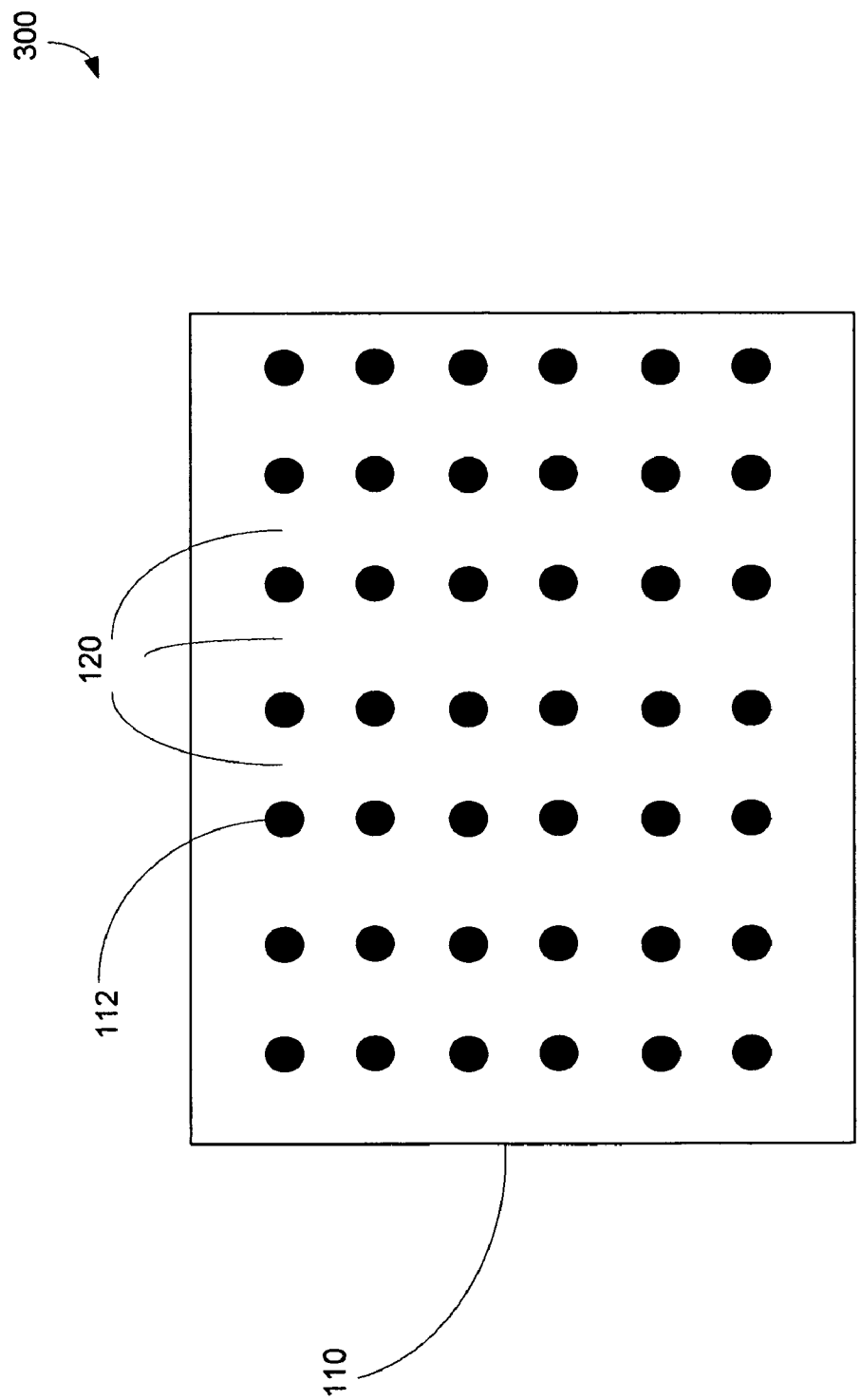
FIG. 3 illustrates a top view of an exemplary lighting device having an array of phosphor islands in accordance with an aspect of the present invention.

FIG. 3 illustrates a top view of a phosphor layer 110 of an exemplary device 300 having an array of phosphor islands in accordance with an aspect of the present invention. Phosphor islands 112 are evenly distributed over phosphor layer 110. It should be noted that spacing 120 between neighboring islands 112 are the same or substantially the same for establishing various passages for cool white light to pass through phosphor layer 110. It should be further noted that the islands are not necessary to be arranged in an array formation. In an aspect, islands 112 are combined into bars or strips for disseminating warm light. In another aspect, islands 112 may be reshaped into one large area for disseminating warm light. Also, islands can be any shapes such as square, circles, ellipses, triangles, and the like.

Figure 4:
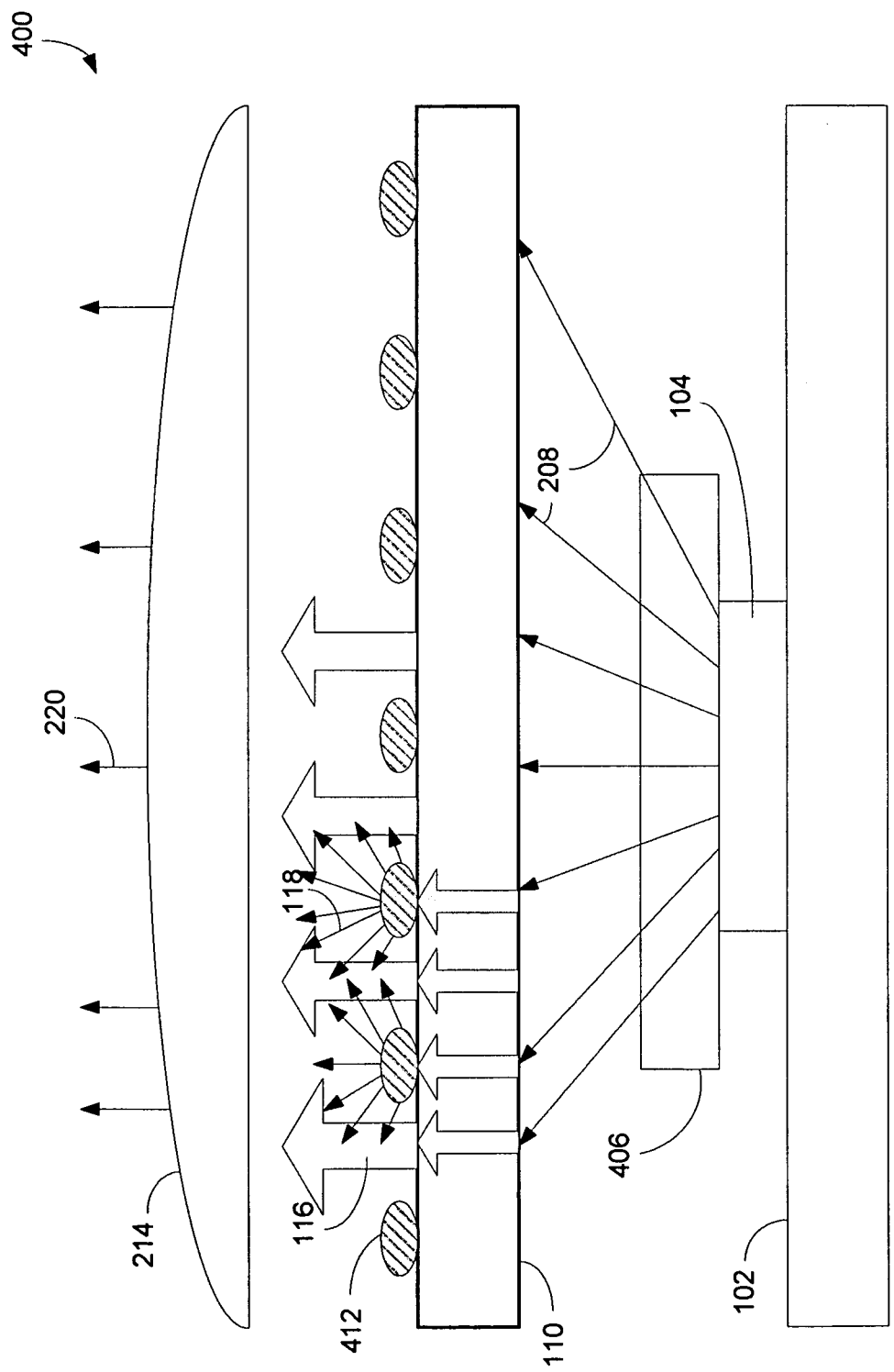
FIG. 4 is a cross-section view of an example of an optical device capable of generating warm white and natural white light using multiple phosphor islands in accordance with an aspect of the present invention.

FIG. 4 illustrates a cross-section view of an optical device 400 capable of generating warm white or neutral white light using multiple phosphor islands in accordance with an aspect of the present invention. Device 400 includes a substrate 102, a solid state light emitter 104, a light extracting layer 406, a phosphor layer 110, a lens 214, and an array of phosphor islands 412. Device 400, in an aspect, is capable of generating natural white or natural visible light by mixing cool white light 116 with warm light 118. Light extracting layer 406 performs similar function(s) as light extracting layer 106 as illustrated in FIG. 1 except that light extracting layer 406 allows space or additional layers between light extracting layer 406 and phosphor layer 110. It should be noted that the underlying concept of the exemplary aspect(s) of the present invention would not change if one or more blocks (or layers) were added to or removed from device 400.

A set of phosphor islands 412 are arranged in an array formation, wherein each island 412 is structured in a spherical shape. The spherical shape includes elliptic shape, round shape, egg shape, and the like. Spacing between phosphor islands 412 is used to facilitate passage for cool white light 116 to reach lens 214 without obstruction. For example, light 208 travels through phosphor layer 110 and becomes cool white light 116 when light leaves phosphor layer 110. Each spherical shaped phosphor island 412, in an aspect, provides various angles for scattering different portion of warm light in different directions in response to angles of each spherical shaped island. An advantage of using spherical shaped phosphor islands 412 is to control scattering of warm rays into cool white light.

Figure 5:
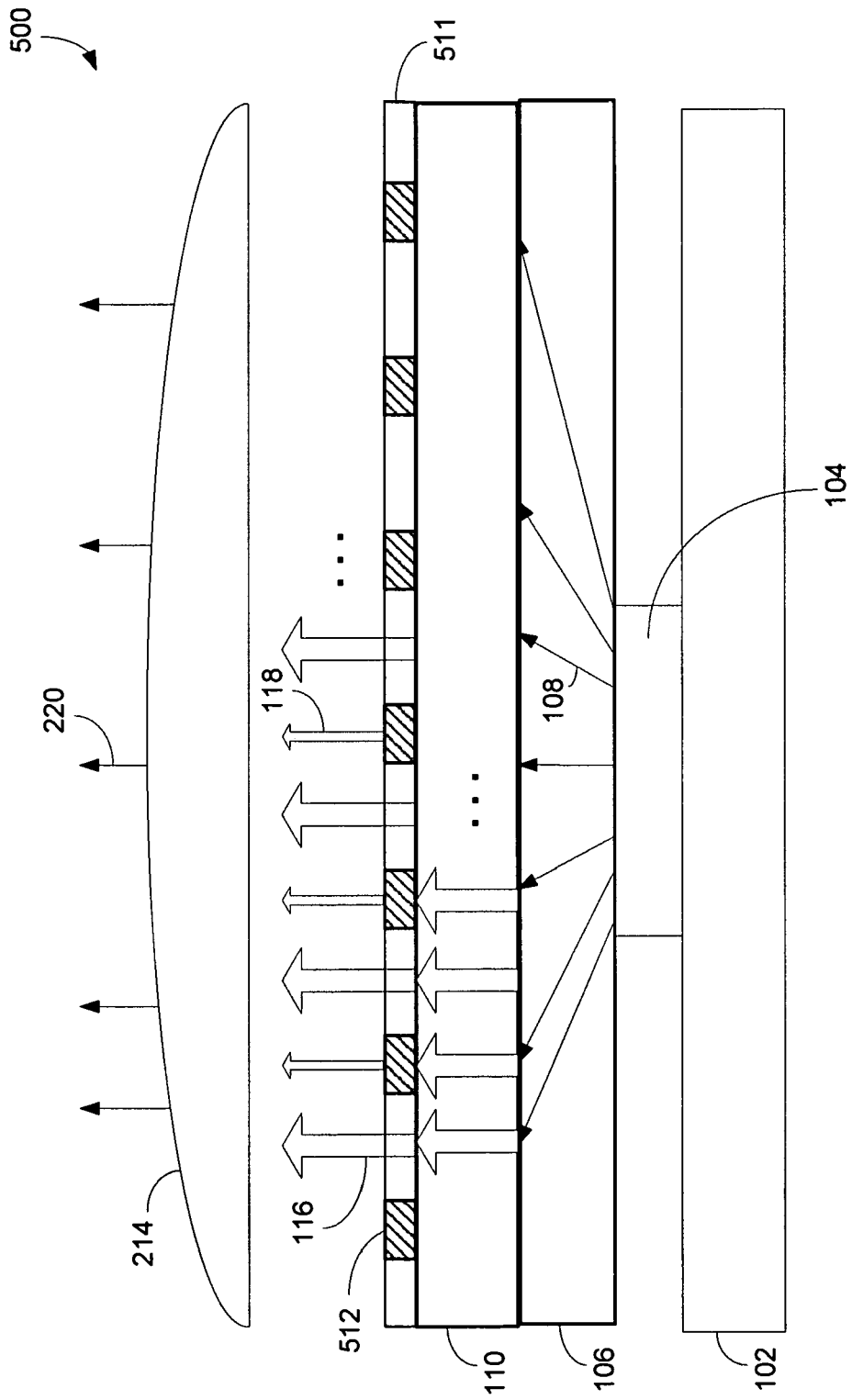
FIG. 5 is a cross-section view of an example of an optical device capable of generating warm white and natural white light using phosphor islands embedded in a film in accordance with an aspect of the present invention.

FIG. 5 illustrates a cross-section view of an optical device 500 capable of generating warm white or natural white light using phosphor islands in accordance with an aspect of the present invention. Device 500 includes a substrate 102, a solid state light emitter 104, a light extracting layer 106, a phosphor layer 110, a lens 214, and an array of phosphor islands 512 embedded in a film 511. Device 500, in an aspect, is capable of generating warm white or natural light by mixing cool white light 116 with red light 118. It should be noted that the underlying concept of the exemplary aspect(s) of the present invention would not change if one or more blocks (or layers) were added to or removed from device 500.

Film 511, in an aspect, embeds an array of phosphor islands 512 capable of emitting warm light. If phosphor islands 512 are red phosphor islands, red light or red ray can be generated when phosphor islands are activated. In an aspect, if phosphor islands 512 are orange phosphor islands, orange light or orange ray may be generated when the islands are activated. The islands are activated when cool white hits the islands.

Each phosphor islands 512, in an aspect, is structured in column shape, wherein the spacing between phosphor islands 512 is used for passages or channels for cool white light 116 to travel from light extracting layer 110 to lens 214. Column shaped phosphor islands 512, in an aspect, assist to generate white or natural white light by converting at least a portion of cool white light to warm light 118. An advantage of using column shaped phosphor islands 512 is to have better control of scattering warm light.

It should be noted that phosphor island 512 can be structured in various shapes, formations, and/or a combination of different shapes or formations. For example, phosphor islands 512 can be constructed in square, hemisphere, rectangular, triangle, spherical, prism and/or hybrid shapes. The hybrid shape may include rectangular shape in the middle while spherical shape at one or both ends of the rectangular. In an aspect, a portion of a phosphor island 512 is in a column shape and another portion of a phosphor island 512 is in a hemisphere shape wherein the column shape is embedded in film 511 while hemisphere shape is formed on the surface of film 511. Phosphor islands 512 can also be structured in irregular shape depending on the applications as well as fabrication process.

Figure 6:
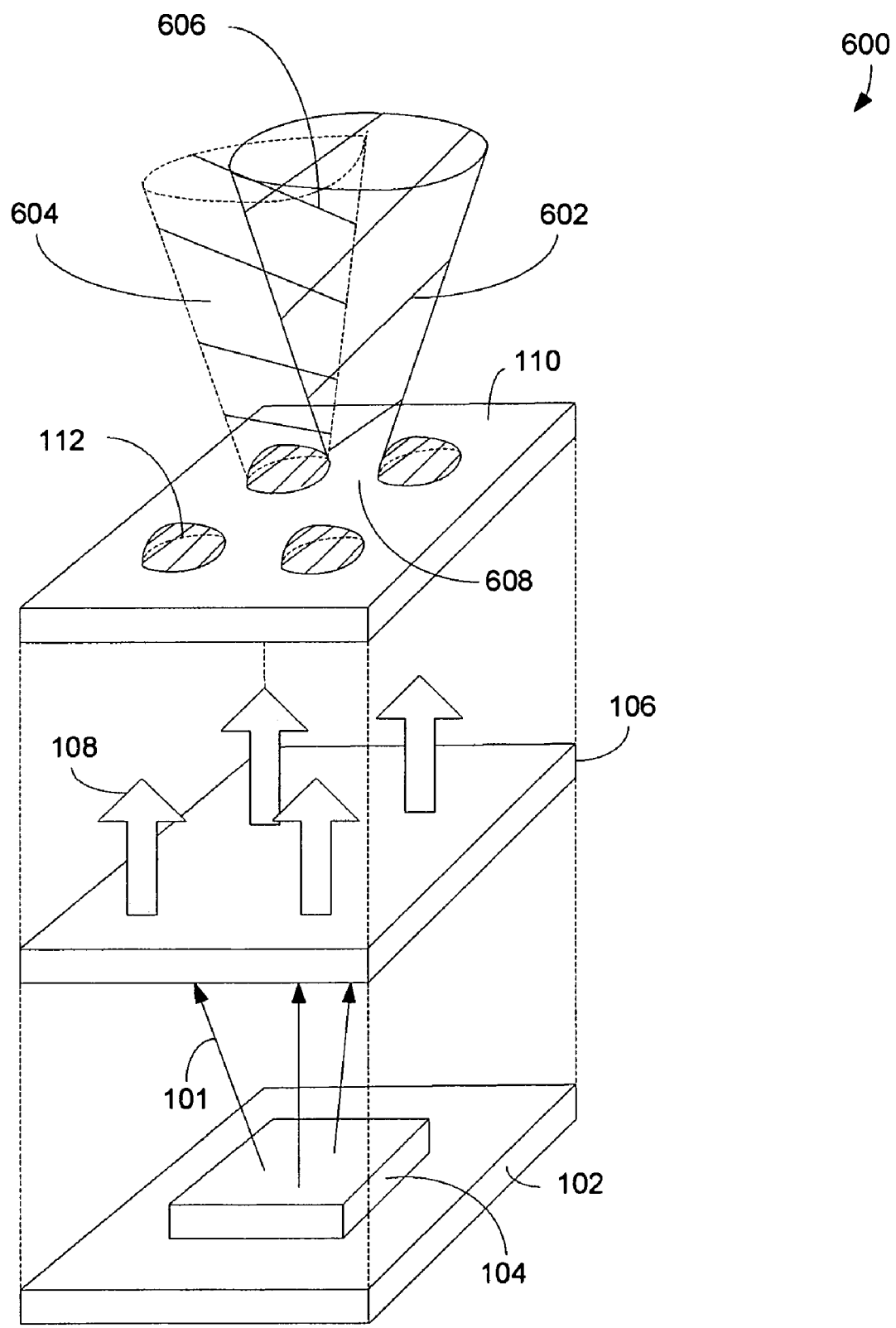
FIG. 6 is a three-dimensional ("3D") perspective diagram illustrating a lighting device capable of generating natural white and warm white light using phosphor islands in accordance with an aspect of the present invention.

FIG. 6 is a three-dimensional ("3D") perspective diagram illustrating a lighting device 600 capable of generating warm white or neutral white using phosphor islands in accordance with an aspect of the present invention. Device 600 includes a substrate 102, a solid state light emitter 104, a light extracting layer 106, a phosphor layer 110, and multiple phosphor islands 112. Device 600, in an aspect, is capable of generating warm white or neutral white light by combining cool white light 602 from space 608 with red light 604 from phosphor islands 112. It should be noted that the underlying concept of the exemplary aspect(s) of the present invention would not change if one or more blocks (or layers) were added to or removed from device 600.

Referring back to FIG. 6, an array of four phosphor islands 112 is disposed over phosphor layer 110. Depending on applications, a different number of phosphor islands 112 can be distributed over phosphor layer 110. For example, a 10×10 or 20×20 array of phosphor islands may be arranged over phosphor layer 110 to produce red light. It should be noted that the overlap portion of red light 604 and cool white light 602 produces warm white or neutral white light 606. It is understood that natural white light 606 should have a CRI range from 70 to 100. The area ratio between phosphor islands 112 and phosphor layer 110, the size and the phosphor concentration of phosphor islands, and distribution, determines light intensity or luminous flux of device 600.

Figure 7:
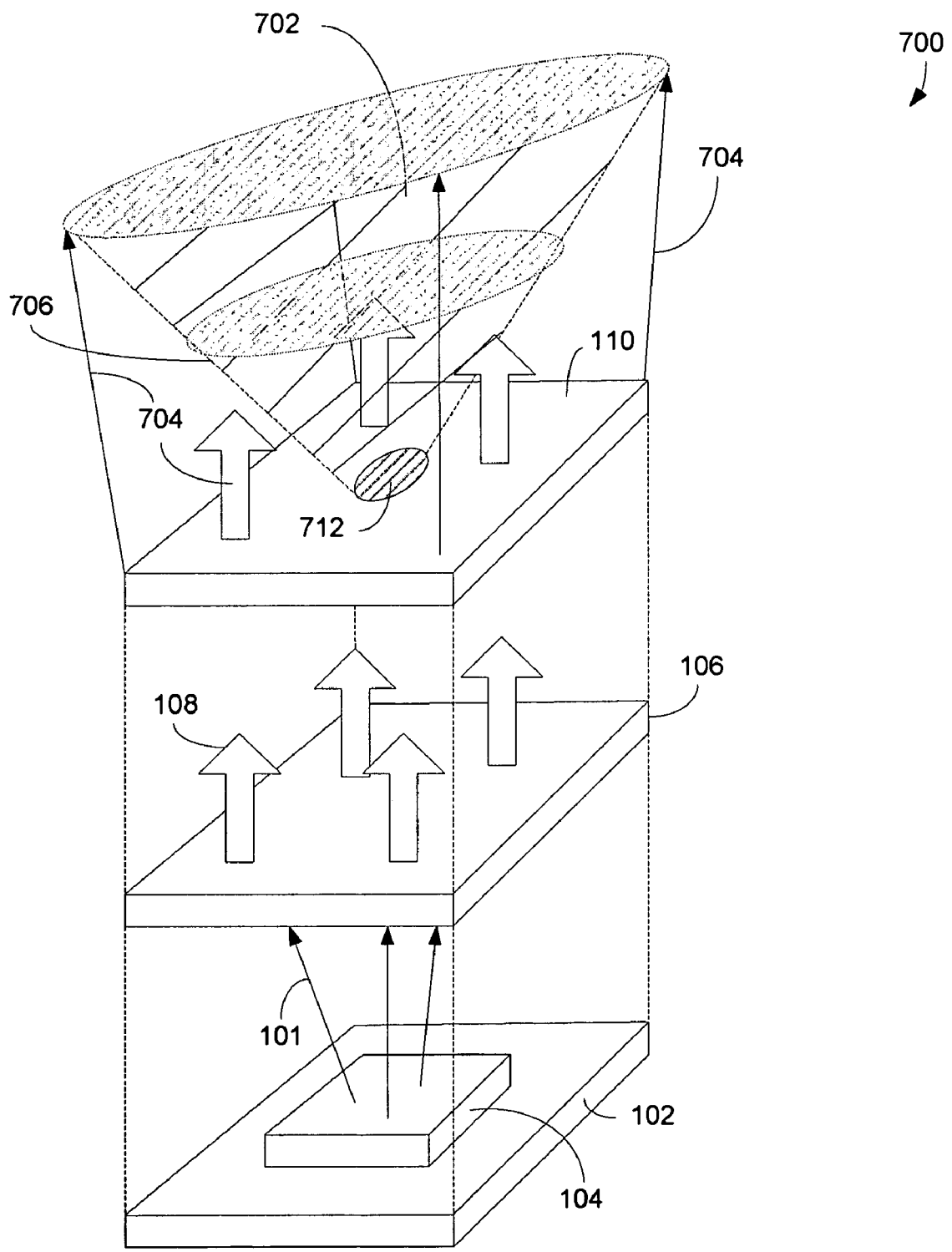
FIG. 7 is a 3D perspective diagram illustrating a lighting device capable of generating natural white and warm white light using a phosphor island in accordance with an aspect of the present invention.

FIG. 7 is a 3D perspective diagram illustrating a lighting device 700 capable of generating natural warm light using a phosphor island in accordance with an aspect of the present invention. Device 700 includes a substrate 102, a solid state light emitter 104, a light extracting layer 106, a phosphor layer 110, and a phosphor island 712. Device 700, in an aspect, is capable of generating natural white or natural visible light by mixing cool light beam 704 with warm light cone 706. It should be noted that the underlying concept of the exemplary aspect(s) of the present invention would not change if one or more blocks (circuit or circuitries) were added to or removed from device 700.

Referring back to FIG. 7, phosphor island 712 is disposed over phosphor layer 110 and is capable of converting a portion of cool white light into a warm light cone 706. Warm light cone 706 is a cone shaped warm ray that is configured to mix the warm ray with cool white light to produce natural warm light 702. Depending on the application, the balance between LOP and CRI of device 700 depends on the size of phosphor island 712. It should be noted that the shape of island 712 can vary depending on the CRI and LOP requirements.

The exemplary aspect of the present invention includes various processing steps, which will be described below. The steps of the aspect may be embodied in machine or computer executable instructions. The instructions can be used to cause a general purpose or special purpose system, which is programmed with the instructions, to perform the steps of the exemplary aspect of the present invention. In another aspect, the steps of the exemplary aspect of the present invention may be performed by specific hardware components that contain hard-wired logic for performing the steps, or by any combination of programmed computer components and custom hardware components.

Figure 8:
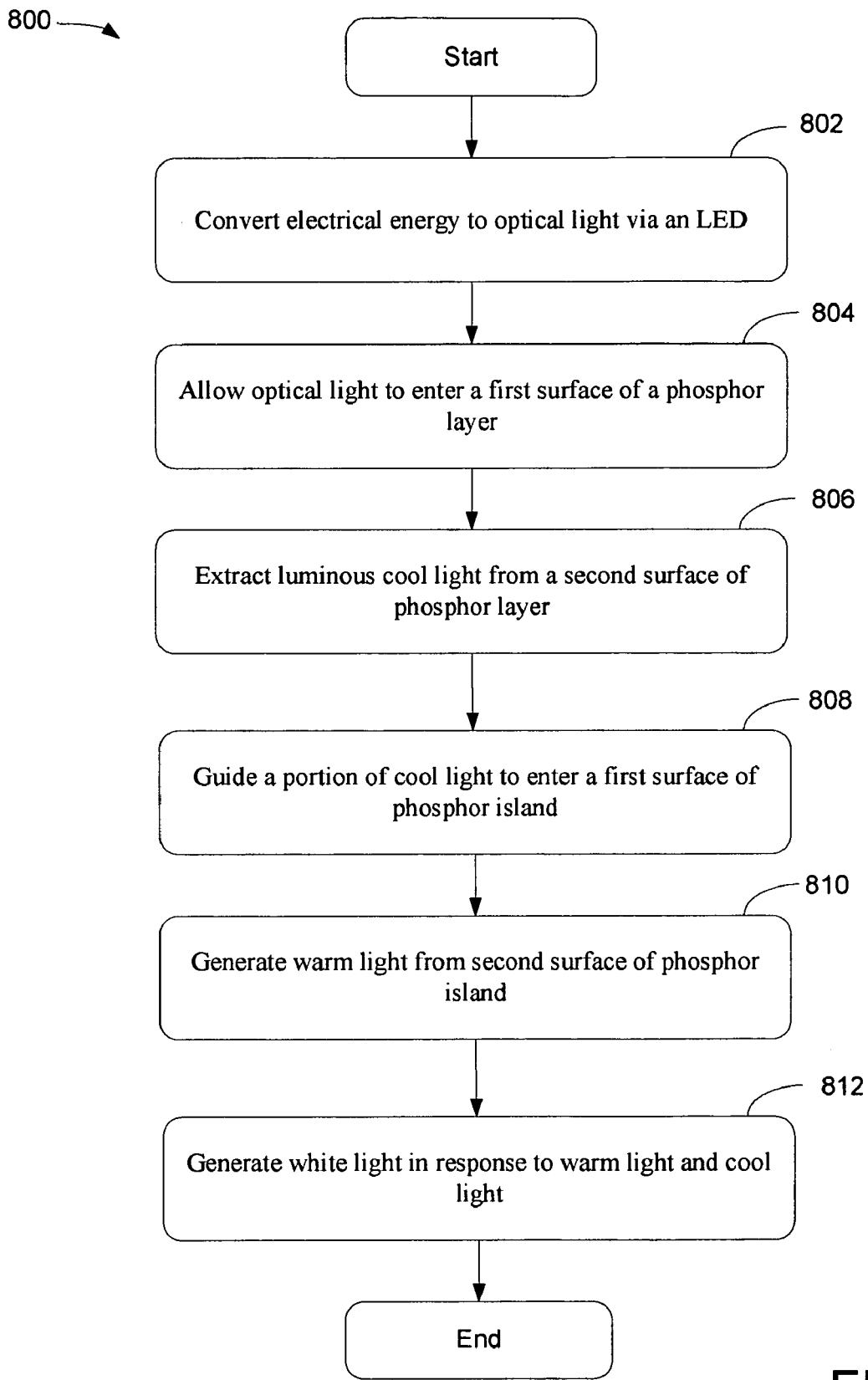
FIG. 8 is a flowchart illustrating a process of generating warm white and natural white light using phosphor islands in accordance with an aspect of the present invention.

FIG. 8 is a flowchart 800 illustrating a process of generating warm white or neutral white light using phosphor islands in accordance with an aspect of the present invention. At block 802, a process uses an LED to convert electrical energy to optical light. It should be noted that other types of solid state light emitting components may be used in place of the LED. In an aspect, the process further uses a clear silicone layer, which is disposed over the LED, to extract blue optical light from the LED. After block 802, the process proceeds to the next block.

At block 804, the process is capable of allowing optical light to enter the bottom surface of a phosphor layer. In an aspect, the phosphor layer includes phosphor substances capable of improving LOP in accordance with blue optical light. After block 804, the process moves to the next block.

At block 806, the process extracts luminous cool white light from the top surface of the phosphor layer. The phosphor layer, in an aspect, is a yellow phosphor layer capable of increasing luminous flux or luminous intensity in accordance with the optical light. For example, the yellow phosphor layer converts blue optical light emitted by an LED to bright cool white light. After block 806, the process proceeds to the next block.

At block 808, the process guides a portion of cool white light entering the bottom surface of phosphor islands, which, in an aspect, are evenly distributed over the top surface of the phosphor layer. The shape of phosphor islands or objects can vary depending on applications. In an aspect, phosphor islands can merge into one single lens-shaped island for distributing warm light. After block 808, the process proceeds to the next block.

At block 810, the process is capable of generating red light from the top surface of multiple phosphor islands in response to at least one portion of cool white light. It should be noted that the phosphor islands are arranged in an array formation over the phosphor layer. In an aspect, the process facilitates and/or allows a portion of cool white light to pass an array of red phosphor objects to generate red light. Also, the process is capable of allowing optical light to pass a green phosphor layer to increase luminous flux. Upon creation of cool white light, a portion of cool white light is converted to orange light after it passes through an array of orange phosphor objects. After block 810, the process proceeds to the next block.

At block 812, the process generates white light in response to red light and cool white light. In an aspect, the process mixes red light with cool white light to generate warm white or neutral white light. In another aspect, the process mixes green light with orange light.

Figure 9:
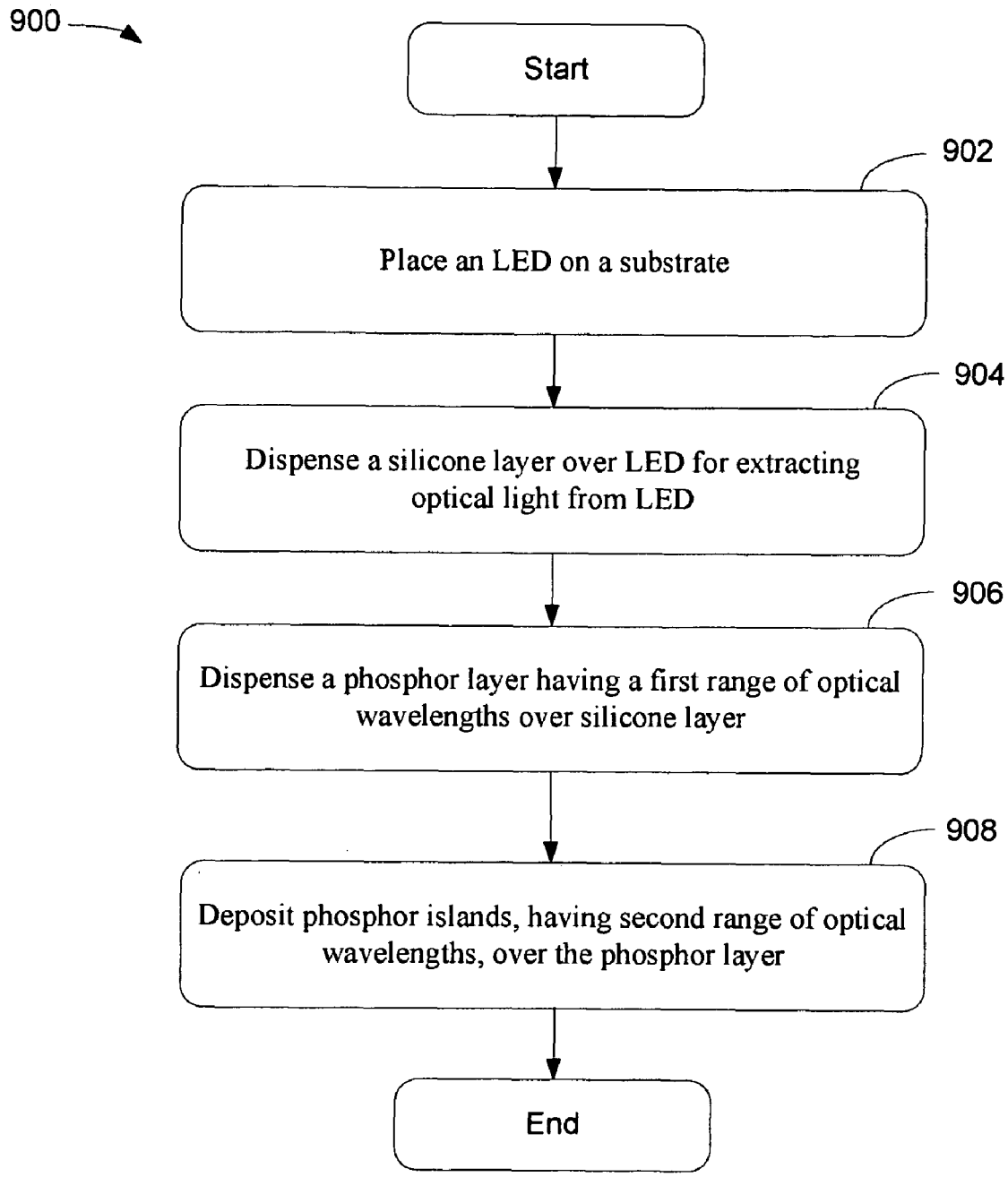
FIG. 9 is a flowchart illustrating a process of manufacturing a lighting device capable of generating natural white light in accordance with an aspect of the present invention.

Having briefly described a process of generating warm white or neutral white light from an aspect of a solid state lighting device, FIG. 9 illustrates a semiconductor fabrication process capable of manufacturing a semiconductor based lighting device. FIG. 9 is a flowchart 900 illustrating a process of manufacturing a lighting device capable of generating warm white or neutral white light in accordance with an aspect of the present invention.

At block 902, a fabrication process places an LED or any other types of solid state light emitting dies on a substrate. For example, the process uses standard eutectic or flux eutectic semiconductor bonding procedures to anchor the LED to the substrate. After block 902, the process proceeds to the next block.

At block 904, the process dispenses a silicone layer over the LED for extracting optical light from the LED. It should be noted that other types of light extracting layers or domes may be used in place of the silicone layer for extracting light. After block 904, the process moves to the next block.

At block 906, the process dispenses a phosphor layer having a first range of optical wavelengths over the silicone layer for generating luminous cool white light. In an aspect, the process uses a jet dispenser to dispense a continuous yellow phosphor layer over the silicone layer. After block 906, the process proceeds to the next block.

At block 908, the process deposits multiple phosphor islands over the phosphor layer for generating warm light. Each phosphor island has a second range of optical wavelengths, wherein the first range of optical wavelengths is shorter than the second range of optical wavelengths. In one example, the process employs a PicoDot™ jet dispenser to dispense an array of red phosphor islands on a yellow phosphor layer. In an aspect, the process can use a method of screen printing to deposit red phosphor islands over the yellow phosphor layer. The process, in an aspect, is further capable of placing a silicone molding lens over phosphor islands for device protection.

Figure 10:
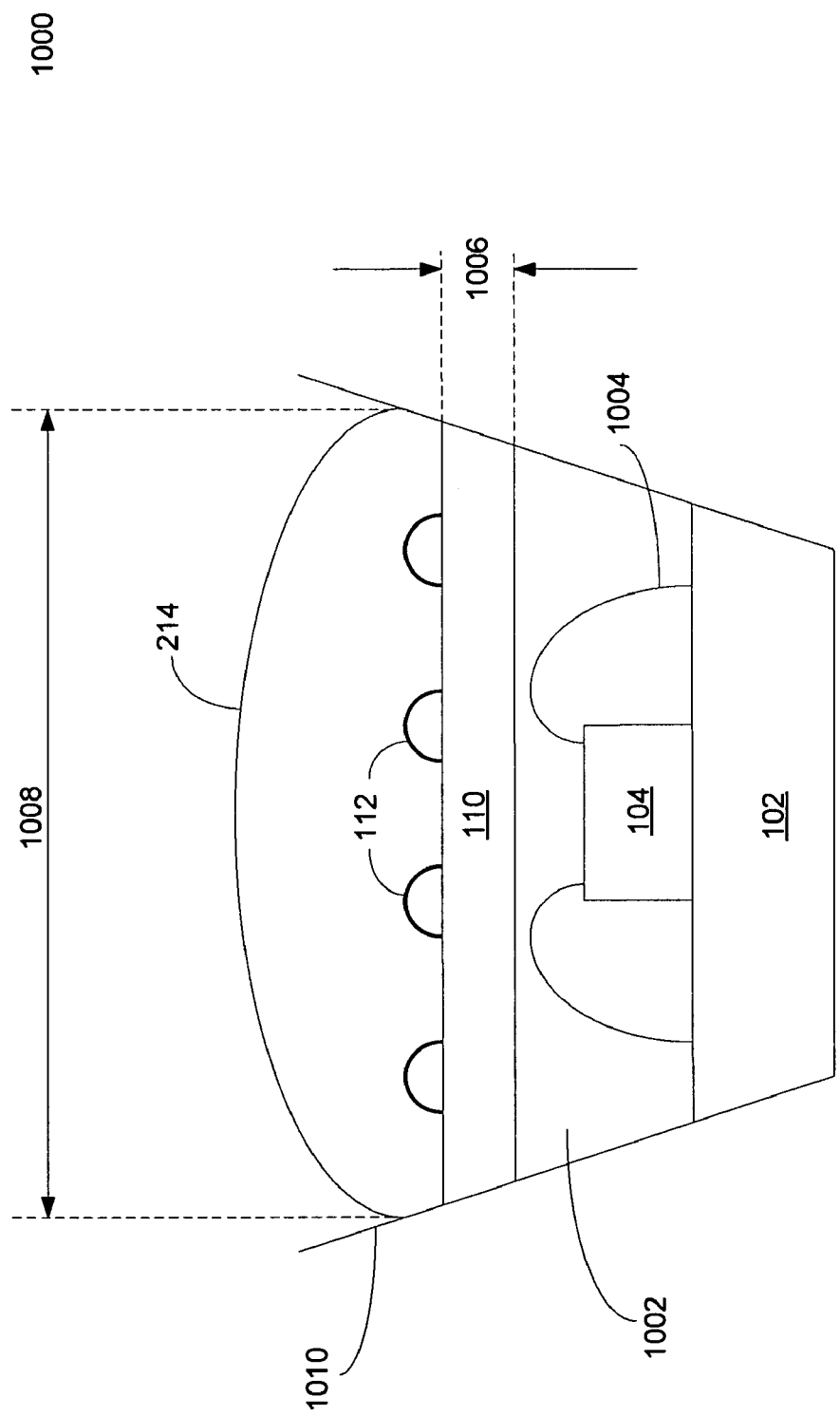
FIG. 10 illustrates a lighting device capable of generating natural white light in accordance with an aspect of the present invention.

FIG. 10 illustrates a lighting device 1000 capable of generating natural white light in accordance with an aspect of the present invention. Device 1000 is fabricated in a cup configuration 1010, wherein it includes a substrate 102, a solid state light emitter 104, a light extracting layer 1002, a phosphor layer 110, a lens 214, and multiple phosphor islands 112. Like devices 100-600, device 1000 is capable of generating natural white or natural visible light in response to cool white light and warm light. It should be noted that the underlying concept of the exemplary aspect(s) of the present invention would not change if one or more blocks were added to or removed from device 1000.

Depending on the application, the dimension of device 1000 can vary. In an aspect, a range of physical dimension 1008 for the top view of device 1000 is from 0.2 centimeter ("cm") to 2 cm. The top view of device 1000, for example, is the lighting area. Various bond wires 1004 are used for transferring electric signals between LED 104 and substrate 102. Light extracting layer 1002 is disposed between substrate 102 and phosphor layer 110 to extract light from LED 104. In addition, light extracting layer 1002 can perform a function of epoxy or polyepoxide, which is a thermosetting epoxide polymer, used to anchor bond wires 1004. It should be noted that light extracting layer 1002 may include multiple layers for extracting light as well as adhesive characteristics.

Phosphor layer 110 can be a yellow phosphor layer, wherein the range of thickness for phosphor layer is, in an aspect, from 0.05 to 20 millimeters ("mm"). It should be noted that the concentration of the phosphor may determine how much light device 1000 can emit. An array of phosphor islands is dispensed over phosphor layer 110. It should be noted that a jet dispenser can be used to achieve controlled dispensing process for high dot-to-dot consistency. For non-contact dispensing of low to high viscosity fluids and/or non-contact jetting, the typical jet dispenser, for example, can cover areas of droplet arrays with shot size starting at 0.002 μl (2 nl) to flow rate up to 300 g/min (10 oz/min). Note that optional precision needle adapter allows contact dispensing of dots and beads with consistency and high positioning precision. Another advantage of using the jet dispenser is fast cycle rates, which, for example, can go up to 150 dots per second, and also integrates a heater with viscosity control.

While particular aspects of the present invention have been shown and described, it will be obvious to those skilled in the art that, based upon the teachings herein, changes and modifications may be made without departing from this exemplary aspect(s) of the present invention and its broader aspects. Therefore, the appended claims are intended to encompass within their scope all such changes and modifications as are within the true spirit and scope of this exemplary aspect(s) of the present invention.

What is claimed is:

1. A light emitting device, comprising:
   a solid state light emitter capable of converting electrical energy to optical light;
   a phosphor layer disposed over the solid state light emitter for generating luminous cool white light in response to the optical light, wherein the phosphor layer has a first range of optical wavelengths; and
   a plurality of phosphor islands disposed over the phosphor layer for converting the cool white light to warm light, wherein the phosphor islands have a second range of optical wavelengths, wherein each of the plurality of phosphor islands is individually deposited onto the phosphor layer.

2. The device of claim 1, further comprising a light extracting layer disposed between the phosphor layer and the solid state light emitter for extracting the optical light from the solid state light emitter.

3. The device of claim 2,
   wherein the light extracting layer is a clear silicone layer; and
   wherein the solid state light emitter is a light emitter diode ("LED").

4. The device of claim 3, wherein the light extracting layer is structured in a dome shape capable of extracting and scattering the optical light from the LED to the phosphor layer.

5. The device of claim 1,
   wherein the phosphor islands are arranged in a substantial evenly distributed formation over the phosphor layer; and
   wherein the first range of optical wavelengths has shorter optical wavelengths than the second range of optical wavelengths.

6. The device of claim 5,
   wherein the first range of optical wavelengths is from 490 nanometers ("nm") to 590 nm; and
   wherein the second range of optical wavelengths is from 590 nm to 750 nm.

7. The device of claim 1,
   wherein the phosphor layer includes yellow phosphor materials; and
   wherein the plurality of phosphor islands includes red phosphor materials.

8. The device of claim 1,
   wherein the phosphor layer includes green phosphor materials; and
   wherein the plurality of phosphor islands includes orange phosphor dots.

9. The device of claim 1, wherein the plurality of phosphor islands is arranged in a substantial evenly distributed array of red phosphor objects capable of emitting red light.

10. The device of claim 9, wherein each of the plurality of phosphor islands is structured in a dome shape for scattering red light.

11. A light emitting device, comprising:
    a light emitter diode ("LED") able to provide blue light in accordance with electrical energy;
    a green phosphor layer disposed over the LED and capable of generating luminous cool white light in response to the blue light, the green phosphor layer having a first side configured to receive the blue light and a second side configured to emit the cool white light, wherein the green phosphor layer has a first range of optical wavelengths; and
    a plurality of red phosphor islands disposed on the second side of the green phosphor layer for generating warm light based on the cool white light, wherein the red phosphor islands have a second range of optical wavelengths.

12. The device of claim 11, further comprising a light extracting layer disposed between the green phosphor layer and the LED for extracting the blue light from the LED.

13. The device of claim 12,
    wherein the light extracting layer is a clear silicone layer; and
    wherein the LED is a solid state light emitter.

14. The device of claim 13, wherein the light extracting layer is structured in a dome shape capable of extracting and scattering the blue light from the LED to the green phosphor layer.

15. The device of claim 11,
    wherein the red phosphor islands are arranged in a substantial evenly distributed formation over the green phosphor layer; and
    wherein the first range of optical wavelengths has shorter optical wavelengths than the second range of optical wavelengths.

16. The device of claim 15,
    wherein the first range of optical wavelengths is from 490 nanometers ("nm") to 590 nm; and
    wherein the second range of optical wavelengths is from 590 nm to 750 nm.

17. The device of claim 11,
    wherein the green phosphor layer includes yellow phosphor materials; and
    wherein the plurality of red phosphor islands includes red phosphor materials.

18. The device of claim 11,
    wherein the green phosphor layer includes green phosphor materials; and
    wherein the plurality of red phosphor islands includes orange phosphor dots.

19. The device of claim 11, wherein the plurality of red phosphor islands is arranged in a substantial evenly distributed array of red phosphor objects capable of emitting red light.

20. The device of claim 11, wherein each of the plurality of red phosphor islands is individually deposited onto the phosphor layer.

* * * * *